(12) United States Patent
Yu et al.

(10) Patent No.: US 11,847,774 B2
(45) Date of Patent: Dec. 19, 2023

(54) DRILL HOLE INSPECTION METHOD, DRILL HOLE INSPECTION SYSTEM AND INSPECTION DEVICE

(71) Applicant: DER LIH FUH CO., LTD., Taoyuan (TW)

(72) Inventors: Chen-Te Yu, Taoyuan (TW); Chia-Chien Pan, Taoyuan (TW); Tai-Been Chen, Taoyuan (TW)

(73) Assignee: DER LIH FUH CO., LTD., Taoyuan (TW)

(*) Notice: Subject to any disclaimer, the term of this patent is extended or adjusted under 35 U.S.C. 154(b) by 218 days.

(21) Appl. No.: 17/406,575

(22) Filed: Aug. 19, 2021

(65) Prior Publication Data

US 2022/0058788 A1  Feb. 24, 2022

Related U.S. Application Data

(60) Provisional application No. 63/068,376, filed on Aug. 21, 2020.

(51) Int. Cl.
*G06T 7/00* (2017.01)
*G06T 7/70* (2017.01)
(Continued)

(52) U.S. Cl.
CPC .............. *G06T 7/0004* (2013.01); *G06T 7/60* (2013.01); *G06T 7/70* (2017.01); *G06T 2200/04* (2013.01);
(Continued)

(58) Field of Classification Search
CPC ........... G06T 7/0004; G06T 7/60; G06T 7/70; G06T 2200/04; G06T 2207/20081;
(Continued)

(56) References Cited

FOREIGN PATENT DOCUMENTS

CN     100440249    * 12/2008
CN     103528566 A   1/2014
(Continued)

OTHER PUBLICATIONS

Yu et al., "A laser scanner based in-process inspection approach of thru-hole for drilling robotic system", Journal of Advanced Control, Automation and Robotics (JACAR), 4 (1): 136-144, Apr. 5, 2018 (Year: 2018).*

(Continued)

*Primary Examiner* — Qian Yang
(74) *Attorney, Agent, or Firm* — ScienBiziP, P.C.

(57) ABSTRACT

A drill hole inspection method for using a drill hole inspection system to inspect a drill hole of a printed circuit board (PCB) is provided. The drill hole inspection method includes: scanning the PCB to obtain 3-dimensional (3D) image voxel data of the PCB; determining a first-dimension interval corresponding to the PCB along one direction of the 3D image voxel data; determining, in a plane of the 3D image voxel data which is orthogonal to the direction, a 2-dimensional (2D) position corresponding to the drill hole; extracting a portion of the 3D image voxel data as drill hole voxel data according to the first-dimension interval and the 2D position; analyzing the drill hole voxel data to obtain an inspection result of the drill hole; and outputting the inspection result through an output component. In addition, a drill hole inspection system and an inspection device using the same are also provided.

18 Claims, 10 Drawing Sheets

(51) Int. Cl.
  *G06T 7/60* (2017.01)
  *H05K 3/00* (2006.01)
(52) U.S. Cl.
  CPC .............. *G06T 2207/20081* (2013.01); *G06T 2207/30141* (2013.01); *H05K 3/0047* (2013.01); *H05K 2203/16* (2013.01)
(58) Field of Classification Search
  CPC . G06T 2207/30141; G06T 2207/10081; G06T 2207/20084; H05K 3/0047; H05K 2203/16; H05K 2203/0207; H05K 2203/163; G01N 21/956; G01N 21/95692; G01N 2021/95638
  See application file for complete search history.

(56) References Cited

FOREIGN PATENT DOCUMENTS

| | | | |
|---|---|---|---|
| CN | 103557793 A | | 2/2014 |
| CN | 110220484 A | | 9/2019 |
| CN | 110839321 | * | 2/2020 |
| TW | M530943 U | | 10/2016 |

OTHER PUBLICATIONS

Machine translation for CN 100440249 (Year: 2008).*
Machine translation for CN 110839321 (Year: 2020).*

* cited by examiner

DRILL HOLE INSPECTION METHOD, DRILL HOLE INSPECTION SYSTEM AND INSPECTION DEVICE

CROSS-REFERENCE TO RELATED APPLICATION(S)

The present application claims priority to a provisional U.S. Patent Application Ser. No. 63/068,376, filed on Aug. 21, 2020, entitled "APPARATUS AND METHOD FOR DEFECT INSPECTION OF PRINTED CIRCUIT BOARDS", the entirely of which is incorporated herein by reference.

FIELD

The present disclosure generally relates to a defect inspection method of a printed circuit board (PCB), and more particularly, to a non-invasive drill hole inspection method, a drill hole inspection system and an inspection device.

BACKGROUND

In the past, artificial intelligence (AI) technology was only visible in research institutes since it consumed large quantities of computing resources and required large amounts of time. In recent years, high speed computing and extremely large amounts of data promote rapid development of AI. As a result, AI has been applied to deal with practical problems in various fields, significantly reducing labor and time costs, and enabling more accurate analysis.

Back drilling, also referred to as controlled depth drilling, is commonly used in a PCB process field to avoid signal distortion caused by reflection, scattering, or delay during high-speed signal transmission. However, in a back-drilling process, if there is an error in a position, an angle or a depth of drilling, a conductor (e.g., copper) may not be removed cleanly, and the resulting conductor residue may cause a PCB to become defective. Conventionally, conductor residue in back-drilled holes can be inspected using tools such as high magnification magnifiers or probes, but such an inspection method is time and labor-consuming, which may result in increasing the production costs and time for PCBs.

SUMMARY

In view of this, the present disclosure provides a drill hole inspection method, a drill hole inspection system and an inspection device, to improve defect inspection efficiency of a drill hole of a PCB.

In a first aspect of the present application, a drill hole inspection system for inspecting a drill hole of a PCB is provided. The drill hole inspection system includes an imaging device, a storage component, an output component and a processor. The imaging device is configured to scan the PCB to obtain 3-dimensional (3D) image voxel data of the PCB. The storage component is configured to store a plurality of modules. The processor is coupled to the imaging device, the storage component and the output component, to access and execute the plurality of modules stored in the storage component. The plurality of modules includes a PCB positioning module, a drill hole positioning module, a voxel extraction module, a drill hole analysis module and an information output module. The PCB positioning module is configured to determine a first-dimension interval corresponding to the PCB along one direction of the 3D image voxel data. The drill hole positioning module is configured to determine, in a plane that is of the 3D image voxel data and that is orthogonal to the direction, a 2-dimensional (2D) position corresponding to the drill hole. The voxel extraction module is configured to extract a portion of the 3D image voxel data as drill hole voxel data according to the first-dimension interval and the 2D position. The drill hole analysis module is configured to analyze the drill hole voxel data to obtain an inspection result of drill hole. The information output module is configured to output the inspection result through the output component.

In another implementation of the first aspect, determining the first-dimension interval corresponding to the PCB along the first direction of the 3D image voxel data includes: projecting the 3D image voxel data onto a second plane to obtain side surface projection data; projecting the side surface projection data onto an axis to obtain 1-dimensional (1D) voxel data, wherein the axis is parallel to the first direction; and determining the first-dimension interval according to the 1D voxel data and a clustering algorithm. The second plane points to a second direction, the first direction is orthogonal to the second direction and the axis is parallel to the first direction.

In another implementation of the first aspect, the first-dimension interval includes a start point and an end point that are on the axis.

In another implementation of the first aspect, the drill hole positioning module is further configured to determine the first plane according to the start point or the end point.

Another implementation of the first aspect further includes a receiving component coupled to the processor and configured to receive work order data corresponding to the PCB. The work order data includes a drill hole coordinate and determining the 2D position corresponding to the drill hole includes: obtaining a 2D block in the first plane according to the drill hole coordinate; and determining the 2D position according to a voxel value of the 2D block.

In another implementation of the first aspect, the work order data further includes at least one of a drill hole size and a size tolerance value and obtaining the 2D block in the first plane according to the drill hole coordinate includes: determining a block size according to the at least one of the drill hole size and the size tolerance value; and obtaining the 2D block in the first plane according to the drill hole coordinate and the block size.

Another implementation of the first aspect further includes, when the drill hole positioning module determines the 2D position according to the voxel value of the 2D block, the following operations are included: calculating a first center of the 2D block by taking the voxel value as a weight; and comparing the first center with a geometric center of the 2D block, to determine the 2D position.

In another implementation of the first aspect, the voxel extraction module is further configured to extract the portion of the 3D image voxel data as the drill hole voxel data according to the first-dimension interval, the 2D position and the block size.

In another implementation of the first aspect, analyzing the drill hole voxel data to obtain the inspection result of the drill hole includes: obtaining a first angle of view image of the drill hole voxel data projected onto the first plane; obtaining a second angle of view image of the drill hole voxel data projected onto a second plane; and inputting the first angle of view image and the second angle of view image to a machine learning model, to generate the inspection result. The first plane is orthogonal to the second plane.

In another implementation of the first aspect, the drill hole is a back drilled hole of the PCB.

In a second aspect, a drill hole inspection method for using a drill hole inspection system to inspect a drill hole of a PCB is provided. The drill hole inspection system includes an imaging device, a processor and an output component. The drill hole inspection method includes: scanning the PCB to obtain 3D image voxel data of the PCB by using the imaging device; determining a first-dimension interval corresponding to the PCB along one direction of the 3D image voxel data by using the processor; determining, in a plane that is of the PCB voxel data and that is orthogonal to the direction, a 2D position corresponding to the drill hole by using the processor; extracting a portion of the 3D image voxel data as drill hole voxel data according to the first-dimension interval and the 2D position by using the processor; analyzing the drill hole voxel data to obtain an inspection result of the drill hole by using the processor; and outputting the inspection result through an output component by using the processor.

In a third aspect, an inspection device including a receiving component, an output component, a storage component and a processor is provided. The receiving component is configured to receive 3D image voxel data of a PCB. The storage component is configured to store a plurality of modules. The processor is coupled to the receiving component, the storage component and the output component to access and execute the plurality of modules stored in the storage component. The plurality of modules includes a PCB positioning module, a drill hole positioning module, a voxel extraction module, a drill hole analysis module and an information output module. The PCB positioning module is configured to determine a first-dimension interval corresponding to the PCB along one direction of the 3D image voxel data. The drill hole positioning module is configured to determine, in a plane that is of the 3D image voxel data and that is orthogonal to the direction, a 2D position corresponding to the drill hole. The voxel extraction module is configured to extract a portion of the 3D image voxel data as drill hole voxel data according to the first-dimension interval and the 2D position. The drill hole analysis module is configured to analyze the drill hole voxel data to obtain an inspection result of drill hole. The information output module is configured to output the inspection result through the output component.

BRIEF DESCRIPTION OF THE DRAWINGS

Aspects of the exemplary disclosure are best understood from the following detailed description when read with the accompanying figures. Various features are not drawn to scale, and dimensions of various features may be arbitrarily increased or reduced for clarity of discussion.

DESCRIPTION

The following description includes specific information about example implementations of the present disclosure. The accompanying drawings and their accompanying detailed descriptions in the present disclosure are only for the example implementations. However, the present disclosure is not limited to these example implementations. Persons skilled in the art will be aware of other variants and implementations of the present disclosure. In addition, the accompanying drawings and examples in the present disclosure are generally not drawn to scale and do not correspond to actual relative sizes.

The term "coupling" is defined as a connection, either directly or indirectly through an intermediate component, and the connection is not necessarily limited to a physical connection. When the term "include" or "contain" is used, it means "include but not limited to", which clearly indicates an open relationship of a combination, a group, series and parities.

In the implementations of this description, an example is provided for inspection of copper leakage of a back-drilled hole of a PCB. However, the present disclosure is not limited thereto. In another implementation, the drill hole inspection method, the drill hole inspection system and the inspection device in the present disclosure may be used to inspect other drill holes than the back-drilled hole of the PCB, and may further be used to inspect other drill hole defects than the copper leakage in the PCB.

In addition, the implementations of this description use one hole in the PCB as an example. However, a plurality of holes in the PCB can be detected by repeating one or more of the steps in the implementations of this description.

Figure 1:
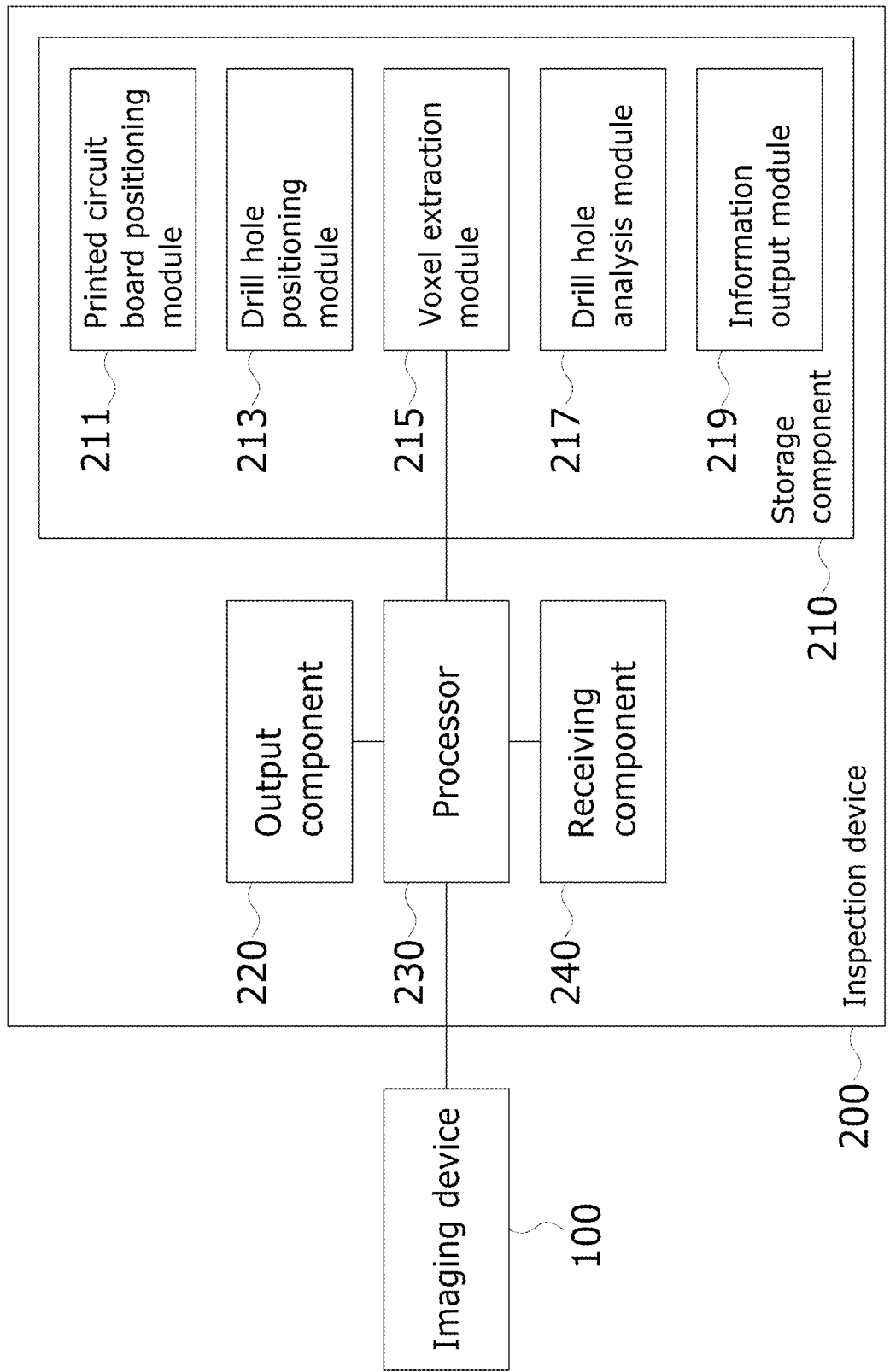
FIG. 1 illustrates a block diagram of a drill hole inspection system in accordance with an example implementation of the present disclosure.

FIG. 1 illustrates a block diagram of a drill hole inspection system in accordance with an example implementation of the present disclosure.

In the implementation shown in FIG. 1, a drill hole inspection system 10 may include an imaging device 100 and an inspection device 200. For example, the drill hole inspection system is used as a station in a PCB production line, and is configured to inspect a drill hole defect of a PCB. In this implementation, the drill hole inspection system is configured to inspect whether copper leakage occurs in a back-drilled hole of the PCB. However, the present disclosure is not limited thereto.

The imaging device 100 is configured to scan a PCB to obtain 3D image voxel data of the PCB which needs to be inspected. In this implementation, the imaging device 100 may be, for example, an X-ray laminography device, and performs a parallel circular motion on top and bottom sides of an object by using an X-ray and a flat panel detector (FPD). Therefore, space efficiency can be effectively improved when the object is in a form of a plate. However, a type of the imaging device 100 is not limited in the present disclosure provided that the PCB can be scanned to obtain 3D image voxel data of the PCB. In another implementation, the imaging device 100 may alternatively be a computer tomography (CT) device.

The inspection device 200 is configured to analyze the 3D image voxel data, to obtain an inspection result of a drill hole of the scanned PCB. In this implementation, the inspection device 200 may include a storage component 210, an output component 220 and a processor 230. The processor 230 is coupled to the imaging device 100, the storage component 210 and the output component 220.

In this implementation, the inspection device 200 may be coupled to the imaging device 100 to form the drill hole inspection system 10. The processor 230 of the inspection device 200 may analyze the 3D image voxel data from the imaging device 100. However, the present disclosure is not limited thereto. In some implementations, the inspection device 200 may alternatively perform an operation independently, to analyze 3D image voxel data of other sources such as the Internet, a cloud hard disk or a portable hard disk. In some implementations, the inspection device 200 may be implemented as a personal computer, a notebook computer, a smartphone, a tablet computer, a personal digital assistant, a cloud storage device or equipment, and any other electronic device with a data computing capability.

The storage component 210 may be, for example, any type of fixed or removable random access memory (RAM), read-only memory (ROM), flash memory, hard disk or another similar component or a combination thereof, and is used to store archival data. In this implementation, the storage component 210 is further configured to store a plurality of modules that can be executed by the processor 230. The modules may include a PCB positioning module 211, a drill hole positioning module 213, a voxel extraction module 215, a drill hole analysis module 217 and an information output module 219.

The output component 220 may be, for example, a liquid crystal display (LCD), a light-emitting diode (LED) display, a field emission display (FED), or another type of display, and is configured to output various types of information to a user. In this implementation, the output component 220 is configured to output the inspection result of the drill hole of the PCB. In another implementation, the output component 220 may include, for example, a speaker, a communications interface or a combination of the components. In other words, an output form of the inspection result is not limited in the present disclosure, and persons of ordinary skill in the art can design the output component 220 according to their needs to output various information.

The processor 230 may be, for example, a central processing unit (CPU) or another programmable general-purpose or special-purpose microprocessor, a digital signal processor (DSP), a programmable controller, an application specific integrated circuit (ASIC), a programmable logic device (PLD), or other similar components or a combination of the components. In this implementation, the processor 230 is configured to access the modules in the storage component 210, to perform a function of inspecting the drill hole, and output the inspection result through the output component 220 to the user.

As shown in FIG. 1, in some implementations, the inspection device 200 may further include a receiving component 240, configured to receive external information. In some implementations, the receiving component 240 may include a communications interface, and may be configured to receive information from external sources such as the Internet, a cloud hard disk or a portable hard disk. In some implementations, the receiving component 240 provides an interface on the inspection device 200 for user operation and may receive a signal generated when the user performs an operation, or may receive data (for example, but not limited to, work order data corresponding to the PCB) entered by the user. For example, the receiving component 240 may include devices such as a keyboard, a mouse, a stylus, a touchpad, and a trackball, external to or built in the inspection device 200, coupled to the processor 230. In another example, the receiving component 240 may be integrated with the output component 220 as one unit, such as a capacitive or resistive touch screen, and used to receive a touch operation of the user. In other words, an input form of external information is not limited in the present disclosure, and persons of ordinary skill in the art can design the receiving component 240 according to their needs to receive information from various sources.

Figure 2:
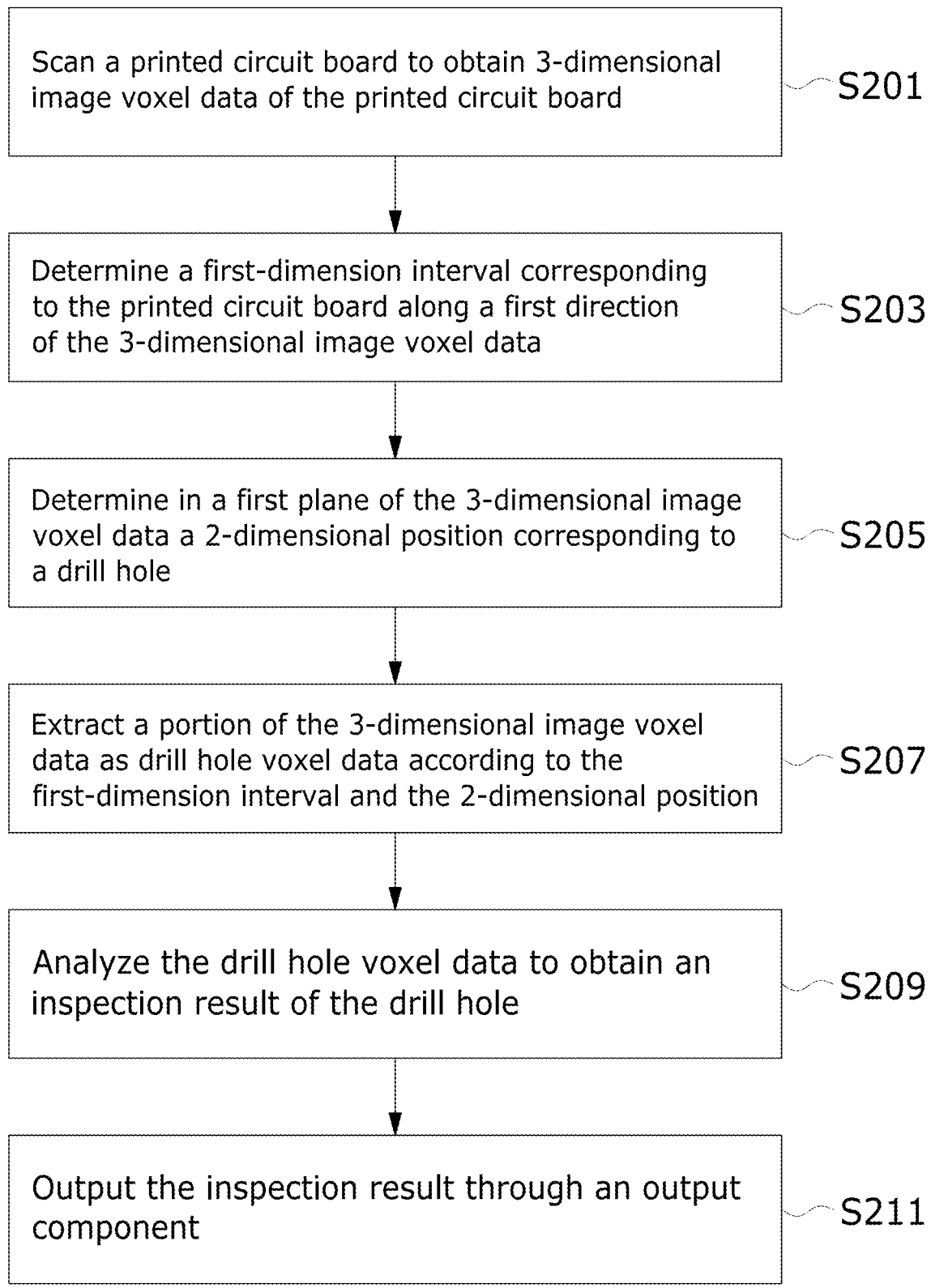
FIG. 2 illustrates a flowchart of a drill hole inspection method in accordance with an example implementation of the present disclosure.
Figure 3:
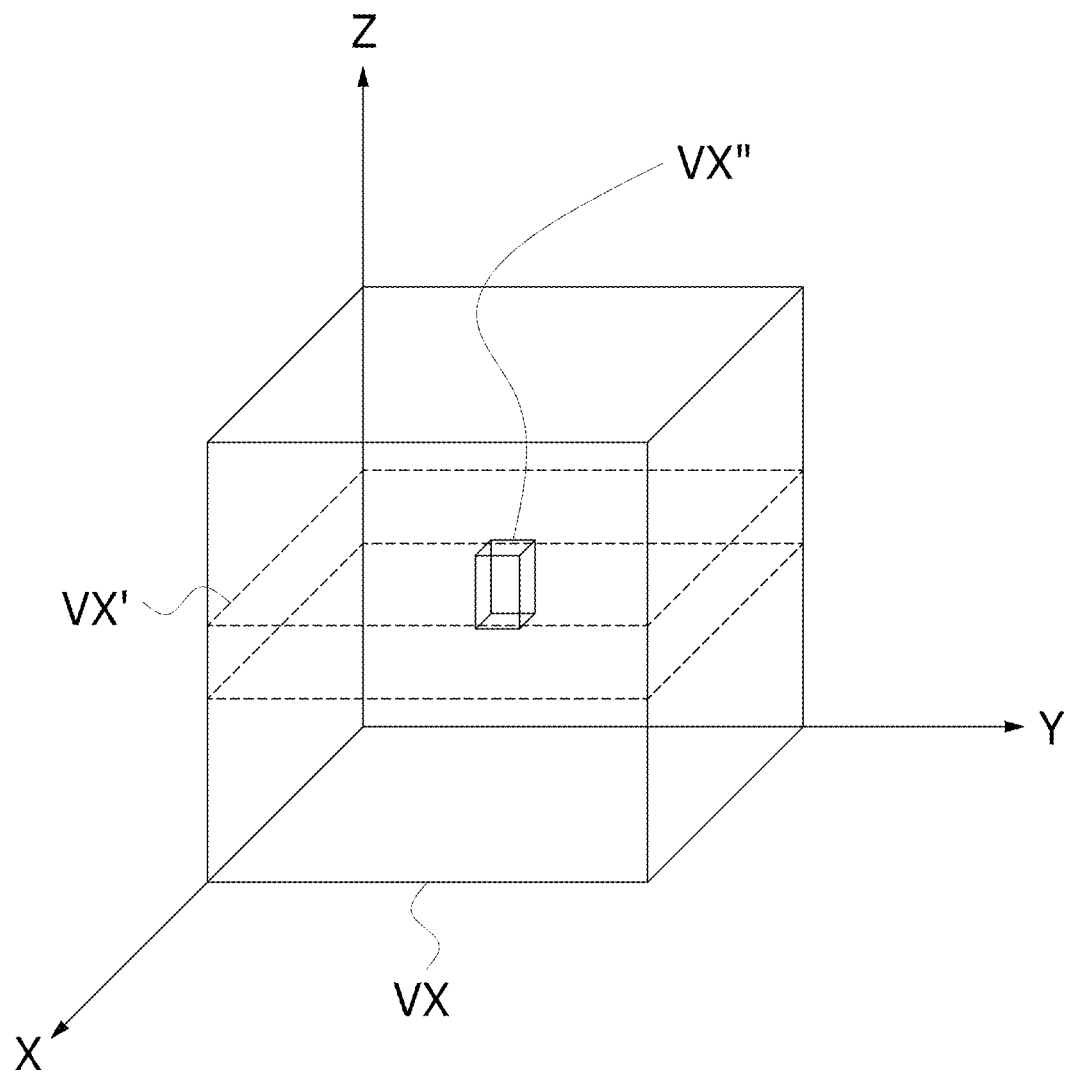
FIG. 3 illustrates a schematic diagram of 3D image voxel data in accordance with an example implementation of the present disclosure.

FIG. 2 illustrates a flowchart of a drill hole inspection method in accordance with an example implementation of the present disclosure. FIG. 3 illustrates a schematic diagram of 3D image voxel data in accordance with an example implementation of the present disclosure.

The method illustrated in FIG. 2 is applicable to the drill hole inspection system 10. The following describes detailed steps of the drill hole inspection method of FIG. 2 in combination with the components of the drill hole inspection system 10 of FIG. 1.

In step S201 of FIG. 2, the imaging device 100 may scan a PCB to obtain 3D image voxel data VX of the PCB.

Specifically, the 3D image voxel data VX can reflect a 3D structure of the PCB. For example, the drill hole inspection system 10 may be a station in a PCB production line, and is configured to inspect whether there is a defect in a back drilling process of the PCB. Therefore, after the back drilling process of the PCB, the PCB may be fed into, for example, the drill hole inspection system 10, and the imaging device 100 performs 3D scanning on the PCB, to obtain the 3D image voxel data VX of the PCB.

In the implementation of FIG. 3, the 3D image voxel data VX may include, for example, a plurality of 3D voxels, and each voxel corresponds to at least one voxel value. Particles or electromagnetic rays (for example, X-rays) that are generated by the imaging device 100 have different transmittance and reflectivity with respect to different media. Therefore, each voxel in the 3D image voxel data VX corresponds to, for example, at least one light intensity value (namely, the voxel value), to further reflect the 3D structure of the PCB. In some implementations, each voxel in the 3D image voxel data VX may alternatively correspond to, for example, a group of RGB values, including three intensity values of red, green, and blue color light.

For convenience, in FIG. 3, the 3D image voxel data VX is aligned to an X axis, a Y axis and a Z axis, and a direction of the Z axis is parallel to a normal direction of a back side (for example, a side with a back-drilled hole) of the PCB. This Euclidean coordinate system or a Cartesian coordinate system is used for the description below. However, the present disclosure is not limited thereto. Persons of ordinary skill in the art can perform an operation on the 3D image voxel data VX according to coordinate transformation as desired and perform an analysis.

It should be noted that the PCB does not fill an entire scanning area when the imaging device 100 is scanning. In this implementation, the 3D image voxel data VX may include a first part, a second part, and a third part in sequence along the Z axis. The first part and the third part correspond to external space of the PCB (for example, space above and space below), and the second part corresponds to the PCB, or corresponds to the PCB and a shelf for placing the PCB. In another implementation, a size of a to-be-inspected PCB may be different. Therefore, a first part, a second part and a third part may all be included in a direction along another axis. The first part and the third part correspond to external space of the PCB, and the second part corresponds to the PCB. In other words, PCB voxel data VX' corresponding to the PCB may account for only a portion of the 3D image voxel data VX.

In this implementation, the processor 230 of the inspection device 200 may receive, via the receiving component 240, the 3D image voxel data VX from the imaging device 100. In some implementations, the processor 230 may obtain, for example, through the receiving component 240, the 3D image voxel data VX corresponding to the to-be-inspected PCB from other sources.

In step S203 of FIG. 2, the PCB positioning module 211 may determine a first-dimension interval corresponding to the PCB along a first direction of the 3D image voxel data VX.

Specifically, the inspection device 200 is configured to inspect a drill hole of the PCB. Therefore, the first part and the third part of the 3D image voxel data VX and which correspond to the external space may be understood as redundant data. An analysis of the redundant data would significantly reduce an inspection speed of the drill hole inspection system 10 or the inspection device 200. Therefore, the PCB positioning module 211 may define a data interval corresponding to the PCB from the 3D image voxel data VX.

In this implementation, the PCB positioning module 211 may define an interval along the first direction, specifically, a thickness direction (for example, the direction of the Z axis) of the PCB. However, the present disclosure is not limited thereto. In another implementation, the PCB positioning module 211 may make a definition along other directions of the PCB. Persons of ordinary skill in the technical art can deduce an implementation from the descriptions of this implementation. Details are not described herein.

Figure 4:
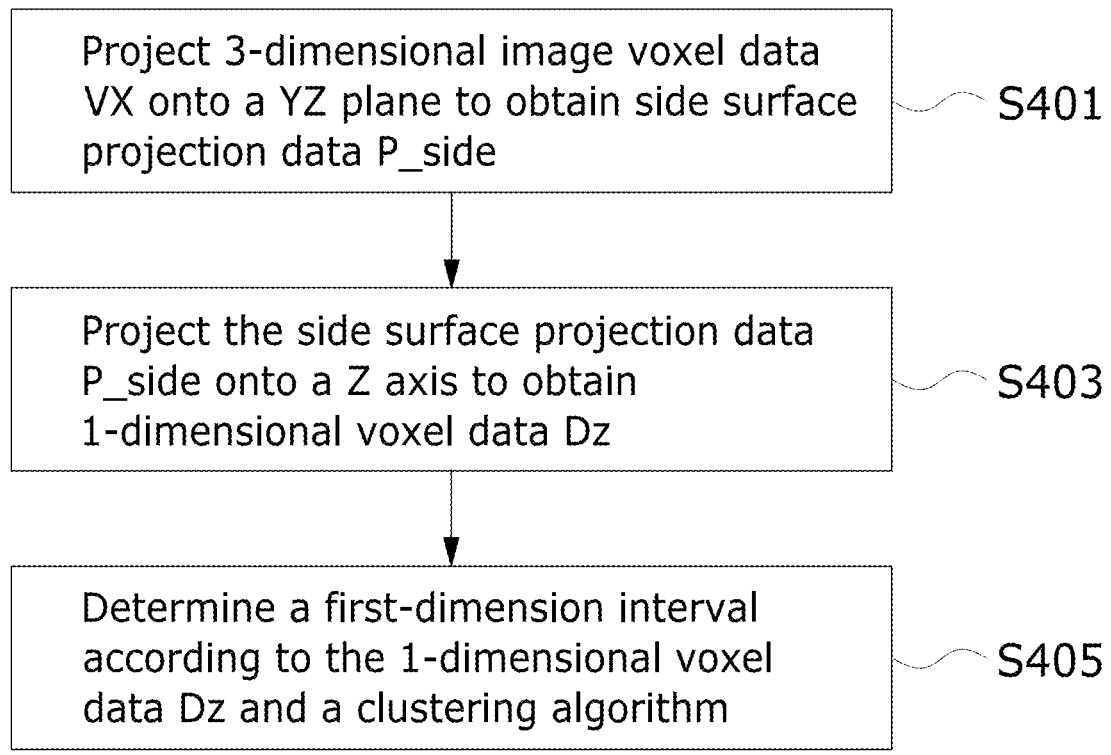
FIG. 4 illustrates a flowchart of a PCB positioning method in accordance with an example implementation of the present disclosure.
Figure 5A:
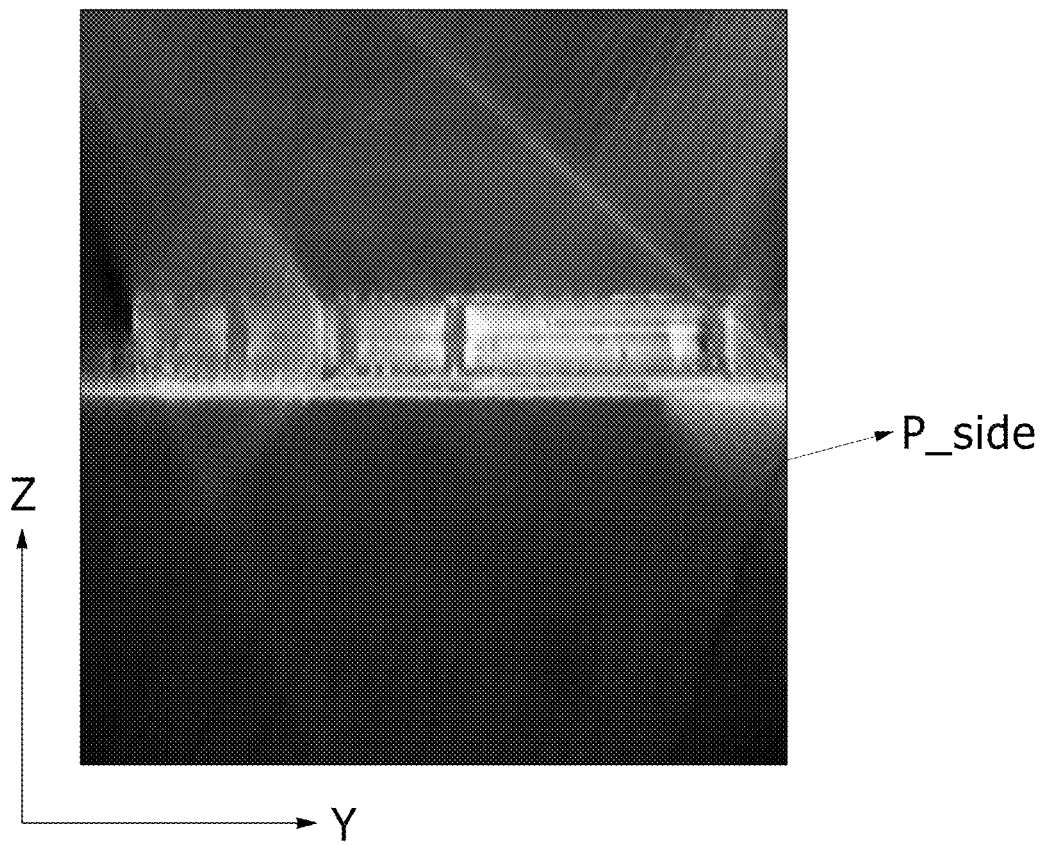
FIG. 5A and FIG. 5B illustrate a schematic diagram of PCB positioning in accordance with an example implementation of the present disclosure.
Figure 5B:
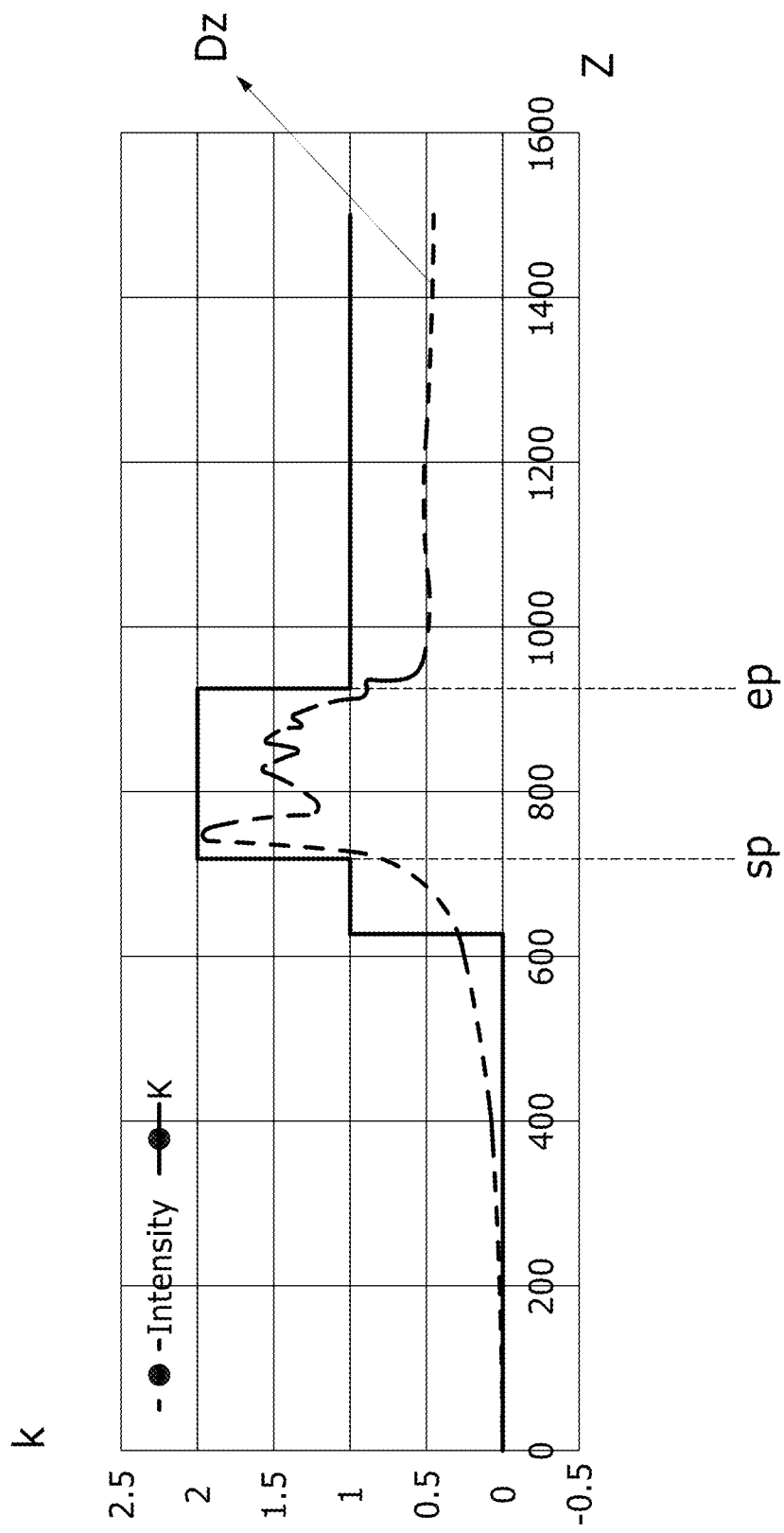

FIG. 4 illustrates a flowchart of a PCB positioning method in accordance with an example implementation of the present disclosure. FIG. 5A and FIG. 5B illustrate a schematic diagram of PCB positioning in accordance with an example implementation of the present disclosure.

In step S401 of FIG. 4, the PCB positioning module 211 may project the 3D image voxel data VX onto a YZ plane to obtain side surface projection data P_side.

In this implementation, a back side of the PCB is corresponding to a first plane (for example, but not limited to, a plane parallel to an XY plane) of the 3D image voxel data VX, and a normal direction of the first plane points to the first direction (for example, but not limited to, the direction of the Z axis). Therefore, in order to obtain the side surface projection data P_side corresponding to the PCB, the PCB positioning module 211 may project the 3D image voxel data VX onto a second plane (for example, but not limited to, a YZ plane). The normal direction of the first plane points to the first direction (for example, but not limited to, the direction of the Z axis). A normal direction of the second plane points to the second direction (for example, but not limited to, the direction of the X axis). In addition, the first direction is orthogonal to the second direction.

In this implementation, the projection is performed, for example, by taking a maximum value. For example, when the 3D image voxel data VX is projected onto the YZ plane, a value that is located at coordinates (j, k) and that is in the side surface projection data P_side is equal to a largest value of all voxel values that are located at a straight line "y=j, z=k" and that are in the 3D image voxel data VX. However, the present disclosure is not limited thereto. In some implementations, the projection may alternatively be performed, for example, by taking an average or using another mathematical function.

In step S403, the PCB positioning module 211 may project the side surface projection data P_side onto the Z axis to obtain 1-dimensional (1D) voxel data Dz.

Specifically, the PCB positioning module 211 may project the side surface projection data P_side onto an axis (for example, but not limited to, the Z axis) in parallel to the normal direction of the first plane, so that the 1D voxel data Dz includes information about a thickness direction (for example, but not limited to, the direction of the Z axis) of the PCB.

In this implementation, the projection is performed, for example, by taking a maximum value. For example, when the side surface projection data P_side is projected onto the Z axis, a value that is located at z=k in the 1D voxel data Dz is equal to a largest value of all values that are located at a line "z=k" in the side surface projection data P_side. However, the present disclosure is not limited thereto. In some implementations, the projection may alternatively be performed, for example, by taking an average or using another mathematical function.

In step S405, the PCB positioning module 211 may determine the first-dimension interval according to the 1D voxel data Dz and a clustering algorithm.

Specifically, the PCB positioning module 211 may group the 1D voxel data Dz into a plurality of groups by using the clustering algorithm. At least one group may indicate a data range corresponding to the PCB. In addition, the PCB positioning module 211 may obtain a start point and an end point of the data range to represent the first-dimension interval. The first-dimension interval in this implementation may correspond to the thickness of the PCB.

In this implementation, as shown in FIG. 5B, the PCB positioning module 211 may group the 1D voxel data Dz into three groups (for example, k=0, 1 or 2) by using, for example, a K-means algorithm, and determine a start point sp and an end point ep on the Z axis according to a group with a highest intensity (for example, k=2). However, the present disclosure is not limited thereto.

In some implementations, the PCB positioning module 211 may alternatively group the 1D voxel data Dz into two groups, four groups, five groups or more groups by using, for example, the K-means algorithm, and determine a start point sp and an end point ep on the Z axis according to at least one group. In some implementations, the PCB positioning module 211 may alternatively select, for example, other clustering algorithms such as Gaussian Mixed Model (GMM), hierarchical clustering, and K-means.

In another implementation, the PCB positioning module 211 may alternatively determine, for example, the data interval corresponding to the PCB based on an algorithm other than the clustering algorithm. For example, the PCB positioning module 211 may box select a range corresponding to the PCB from the side projection data P_side by using, for example, an artificial intelligence image recognition technology, to determine the first-dimension interval to which the PCB corresponds. For another example, the PCB positioning module 211 may find edges in the side surface projection data P_side by using image processing algorithms such as edge detection, to determine the first-dimension interval to which the PCB corresponds.

In step S205 of FIG. 2, the drill hole positioning module 213 may determine a 2D position corresponding to a drill hole in the first plane of the 3D image voxel data VX.

Specifically, the drill hole positioning module 213 may determine, in the first plane of the 3D image voxel data VX, the 2D position that corresponds to the drill hole of the PCB and that is the position of the 3D image voxel data VX. The first plane corresponds to a layer of the PCB. In other words, the first plane is parallel to a plane that corresponds to the front side or the back side of the PCB and that is in the 3D image voxel data VX. In this implementation, the first plane corresponds to the back side of the PCB (for example, a plane "z=ep" in the 3D image voxel data VX). In another implementation, the first plane corresponds to the front side of the PCB (for example, a plane of z=sp in the 3D image voxel data VX) or corresponds to another plane parallel to the front side or back side of the PCB.

In addition, the 2D position is used for positioning the drill hole in the first plane. In this implementation, the 2D position may be, for example, 2D coordinate corresponding to a center of the drill hole in the PCB in the first plane. In another implementation, the 2D position may alternatively represent 2D coordinate corresponding to any other feature point of the drill hole in the first plane.

Figure 6:
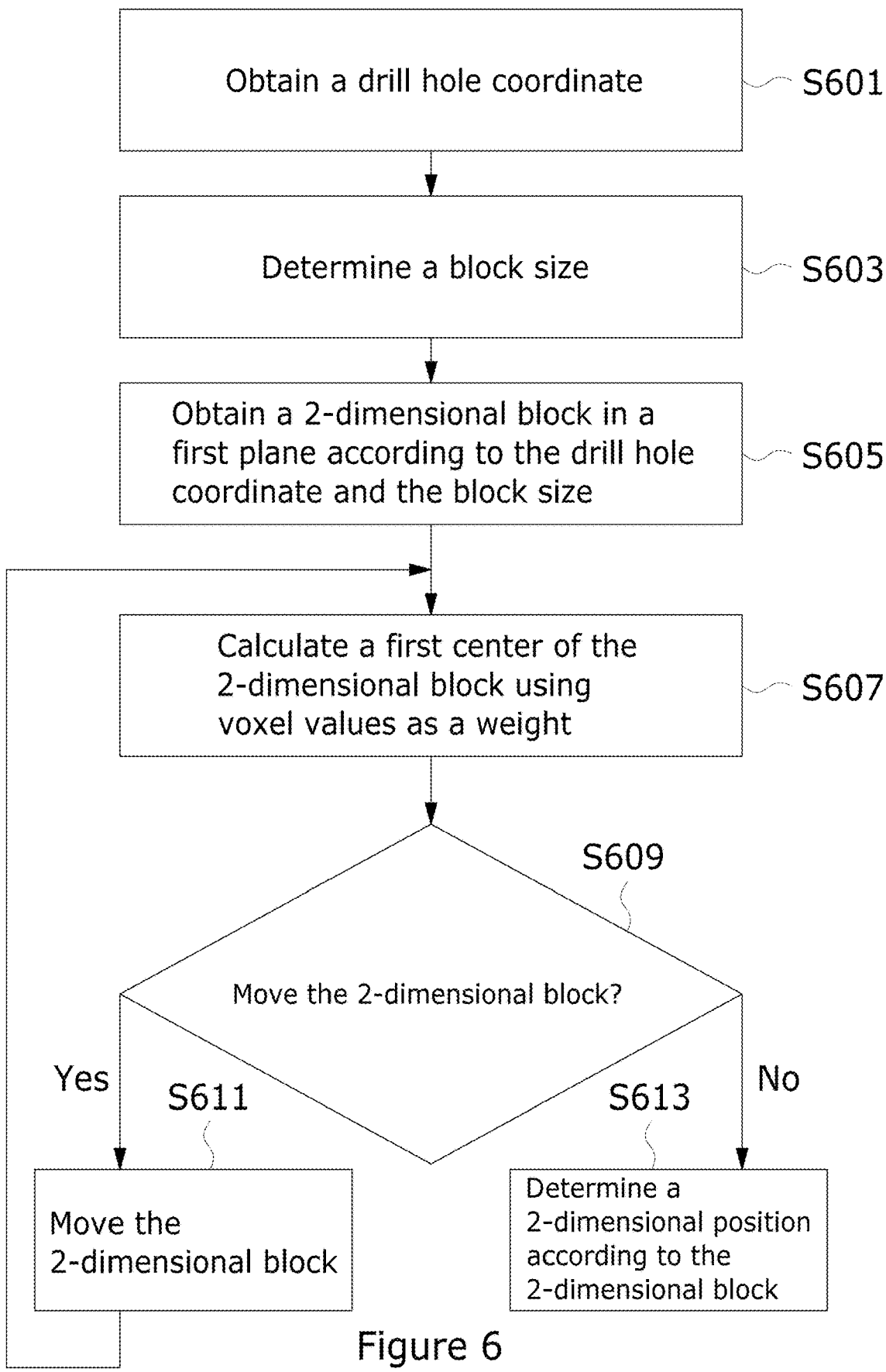
FIG. 6 illustrates a flowchart of a drill hole positioning method in accordance with an example implementation of the present disclosure.
Figure 7:
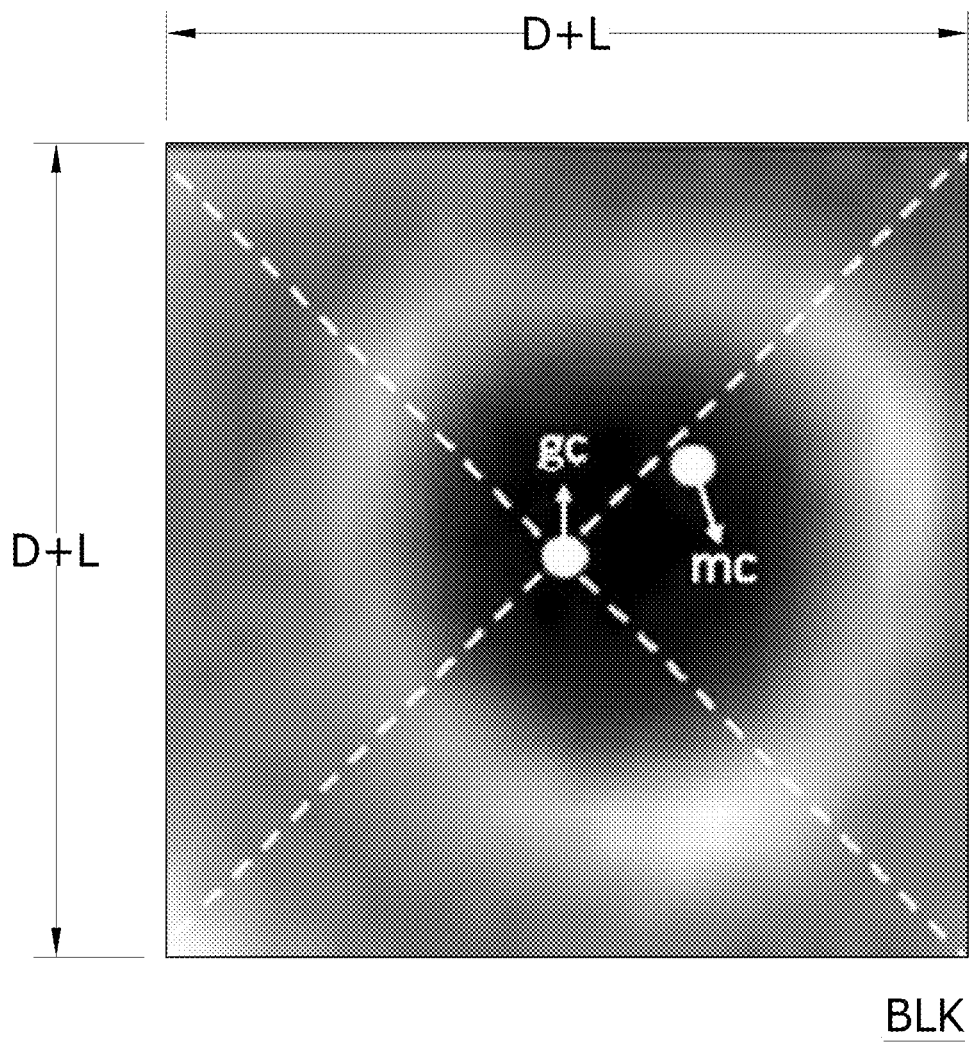
FIG. 7 illustrates a schematic diagram of drill hole positioning in accordance with an example implementation of the present disclosure.

FIG. 6 illustrates a flowchart of a drill hole positioning method in accordance with an example implementation of the present disclosure. FIG. 7 illustrates a schematic diagram of drill hole positioning in accordance with an example implementation of the present disclosure.

In step S601 of FIG. 6, the drill hole positioning module 213 may obtain a drill hole coordinate.

Specifically, the drill hole positioning module 213 may obtain the drill hole coordinate through the receiving component 240. For example, the drill hole coordinate is a coordinate used to indicate a position of the drill hole in a PCB design. In this implementation, the receiving component 240 may receive, for example, work order data corresponding to the PCB, and the work order data includes information such as the drill hole coordinate. In some implementations, the receiving component 240 may alternatively receive, for example, drill hole coordinate entered by a user. Due to possible deviations in a process or during scanning, the drill hole coordinate sometimes cannot be used to accurately define the 2D position in the first plane of the 3D image voxel data VX.

In step S603, the drill hole positioning module 213 may determine a block size.

Specifically, the block size is used for box selecting a block corresponding to the drill hole in the first plane. For example, when the block is a rectangle, the block size includes a length and a width of the rectangle; when the block is a circle, the block size includes at least a radius of the circle. In other words, the drill hole positioning module 213 can box select a 2D block BLK in the first plane provided that there are both a 2D position and a block size.

In this implementation, the drill hole positioning module 213 may determine the block size according to, for example, a drill hole size and a size tolerance value. FIG. 7 provides an example. If the 2D block BLK is set to be a square, and a drill hole diameter is D, the drill hole positioning module 213 may determine that a side length of the 2D block BLK is the drill hole diameter D plus the size tolerance value L. The size tolerance value L may be associated with a distance between two drill holes in a PCB design. For example, the size tolerance value L is set to be, for example, not greater than a minimum distance between two neighboring drill holes in the PCB. However, the present disclosure is not limited thereto.

In this implementation, the work order data from the receiving component 240 may include information about the drill hole diameter D and the size tolerance value L. In some implementations, the work order data includes information about the drill hole diameter D but does not include information about the size tolerance value L, and the size tolerance value L may be, for example, a default system value or entered by a user. In some implementations, the work order data includes information about the size tolerance value L but does not include information about the drill hole diameter D, and the drill hole diameter D may be, for example, a default system value or entered by a user.

In step S605, the drill hole positioning module 213 may obtain the 2D block BLK in the first plane according to the drill hole coordinate and the block size.

In this implementation, for example, the drill hole positioning module 213 may use the drill hole coordinate as a center of a square 2D block BLK, and use the drill hole diameter D plus the size tolerance value L as a side length of the 2D block BLK, to obtain the 2D block BLK in the first plane.

As described in the foregoing paragraphs, since the drill hole coordinate is obtained from the work order data or entered by the user, there may be an error in the 2D block BLK obtained according to the drill hole coordinate without any correction. Consequently, a range corresponding to the drill hole may not be correctly box selected in the first plane.

In step S607, the drill hole positioning module 213 may use a plurality of voxel values in the 2D block BLK as a weight, to calculate a first center mc of the 2D block BLK.

In this implementation, each voxel value of the 3D image voxel data VX may reflect, for example, a physical property of a relative position at the PCB (for example, but not limited to, a material or a density). Therefore, the first center mc calculated by using the voxel values of the 2D block BLK as the weight may be considered as a center of mass corresponding to the drill hole.

In step S609, the drill hole positioning module 213 may compare the first center mc with a geometric center gc of the 2D block BLK, to determine whether to move the 2D block BLK.

In this implementation, the drill hole positioning module 213 may determine whether the first center mc coincides with the geometric center gc of the 2D block BLK, and determines to move the 2D block BLK when determining that the first center mc does not coincide with the geometric center gc of the 2D block BLK. For example, the drill hole positioning module 213 may determine whether a distance between the first center gc and the geometric center mc is larger than a preset threshold. If yes, the first center mc does not coincide with the geometric center gc of the 2D block BLK, the 2D block BLK is determined to be moved and step S611 is performed; otherwise, step S613 is performed.

In this implementation, the geometric center mc of the 2D block BLK may be, for example, located at the drill hole coordinate when step S609 is initially entered.

In step S611, the drill hole positioning module 213 may move the 2D block BLK.

Specifically, the drill hole positioning module 213 moves the 2D block BLK to enable the first center mc of the moved 2D block BLK to coincide with the geometric center gc of the moved 2D block BLK. In this implementation, the drill hole positioning module 213 may return to perform, for example, step S607 after moving the 2D block BLK. In other words, in this implementation, the drill hole positioning module 213 may use an iterative method to move the 2D block BLK until the first center mc of the 2D block BLK coincides with the geometric center gc of the 2D block BLK.

For example, if the drill hole positioning module 213 determines that the first center mc does not coincide with the geometric center gc in step S609, and further determines that the first center mc is located to the right of the geometric center gc, the drill hole positioning module 213 may move, for example, the 2D block BLK a predetermined distance to the right in step S611. However, the present disclosure does not limit specific details of moving the 2D block BLK by the drill hole positioning module 213 provided that the 2D block BLK can be moved to make the first center mc of the 2D block BLK to be coincided with the geometric center gc.

In step S613, the drill hole positioning module 213 may determine a 2D position based on the 2D block BLK.

Specifically, when the first center gc of the 2D block BLK coincides with the geometric center mc, it may be considered that the 2D block BLK can box select a range corresponding to the drill hole in the first plane. In this implementation, the drill hole positioning module 213 may take, for example, the coordinate of the first center gc or the geometric center mc of the 2D block BLK as the 2D position.

In some implementations, the information output module 219 may output, for example, voxel values of the 2D block BLK in step S613 in a bitmap file format (e.g., a .BMP file) to allow a user to review and further determine whether the drill hole positioning module 213 accurately box selected the range corresponding to the drill hole. The user can further interact with the inspection device 200 through the receiving component 240 to move the 2D block BLK or to adjust a size of the 2D block BLK.

It is noted that whether the 2D position can be used to accurately box select the range corresponding to the drill hole on the first plane is directly related to the accuracy of the inspection result in the subsequent steps (e.g., step S609). Table 1 shows the effects of the implementation of FIG. 6 with respect to the inspection result. The drill hole "adjusted" means that the 2D position is obtained through the method of FIG. 6, and the drill hole "unadjusted" means that the 2D position is directly taken as the drill hole coordinate recorded in the work order data. As shown in Table 1, the sensitivity, the specificity, and the accuracy of the inspection result are significantly improved by determining the 2D position through the implementation of FIG. 6.

TABLE 1

| Drill hole | Sensitivity | Specificity | Accuracy |
| --- | --- | --- | --- |
| Adjusted | 0.68 | 0.78 | 0.72 |
| Unadjusted | 0.91 | 0.99 | 0.95 |

In addition to the iterative method described with respect to FIG. 6, in some implementations, the drill hole positioning module 213 may further use, for example, an artificial intelligence image recognition technology to box select the range corresponding to the drill hole in the first plane of the 3D image voxel data VX to find the 2D position as well as the block size.

Returning to FIG. 2, in step S207, the voxel extraction module 215 may extract, according to the first-dimension interval and the 2D position, a portion of the 3D image voxel data VX as drill hole voxel data VX".

Specifically, the first-dimension interval determined by the PCB positioning module 211 may be used to position, in the 3D image voxel data VX, PCB voxel data VX' corresponding to the PCB. The 2D position determined by the drill hole positioning module 213 may be further used to position, in the PCB voxel data VX', the drill hole voxel data VX" corresponding to the drill hole.

In this implementation, the voxel extraction module 215 may extract the drill hole voxel data VX" in the 3D image voxel data VX according to the first-dimension interval, the 2D position and the block size. A dimension of the drill hole voxel data VX" is defined by using the first-dimension interval, and two other dimensions are defined by using the 2D position and the block size. Therefore, if the 3D drill hole voxel data VX" is extracted for analysis, a computation amount during the analysis can be significantly reduced, to improve analysis efficiency.

Figure 8:
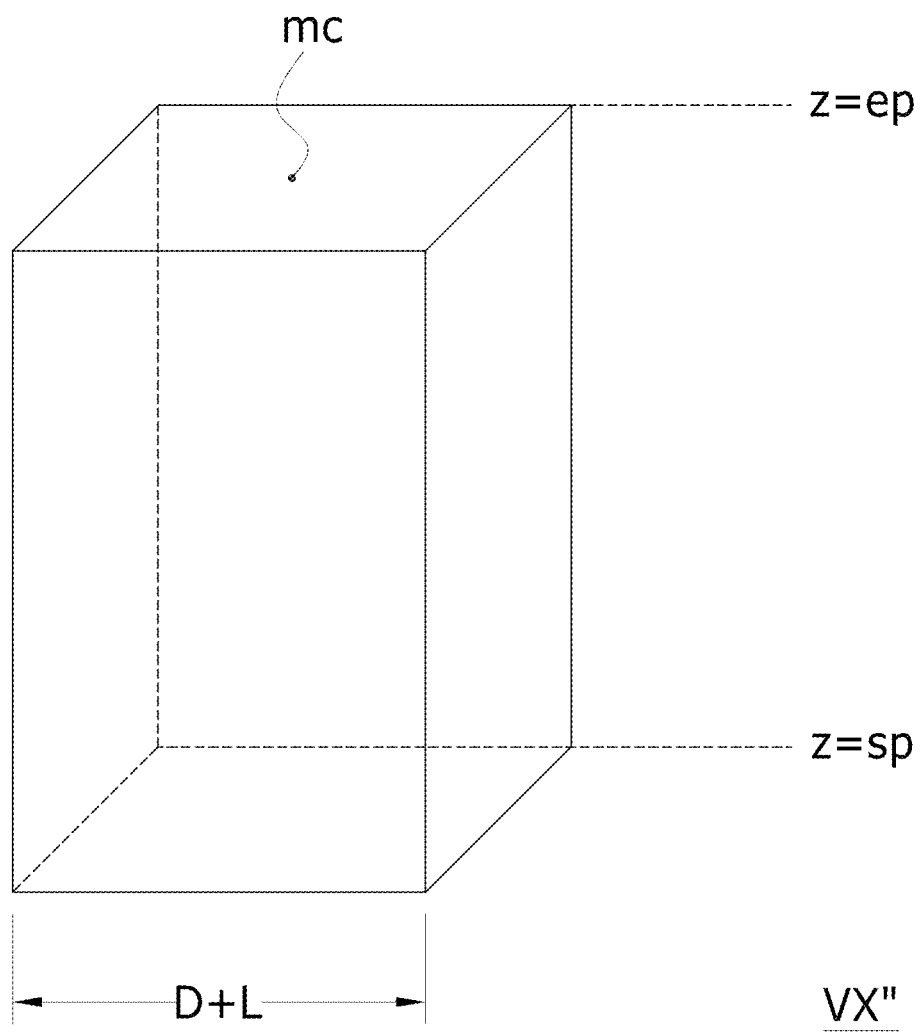
FIG. 8 illustrates a schematic diagram of drill hole voxel data in accordance with an example implementation of the present disclosure.

FIG. 8 illustrates a schematic diagram of drill hole voxel data in accordance with an example implementation of the present disclosure.

In FIG. 8, a center coordinate of drill hole voxel data VX" in a first plane may be determined according to the 2D position (for example, a first center mc of a 2D block BLK), an area range of the drill hole voxel data VX" in the first plane may be determined according to the block size (for example, a side length is a drill hole diameter D plus a size tolerance value L), and a height or a thickness of the drill hole voxel data VX" is determined according to the first-dimension interval (for example, from a start point sp to an end point ep).

In step S209 of FIG. 2, a drill hole analysis module 217 may analyze the drill hole voxel data VX" to obtain an inspection result of the drill hole.

Specifically, the drill hole analysis module 217 may analyze a voxel value in the drill hole voxel data VX", to obtain the inspection result of the drill hole. The inspection result may include, for example, whether the drill hole has a defect, defect types, or the like. Compared with analyzing voxel values in 3D image voxel data VX, or voxel values in PCB voxel data VX', analyzing voxel values in the drill hole voxel data VX" is more accurate and efficient.

In this implementation, the drill hole analysis module 217 may analyze, by using a machine learning model, the voxel values in the drill hole voxel data VX", to obtain an inspection result about "whether copper leakage occurs in the drill hole". However, the present disclosure is not limited thereto. In another implementation, the drill hole analysis module 217 may analyze, by using another analysis method, the voxel values in the drill hole voxel data VX", and obtain another inspection result of the drill hole.

Figure 9C:
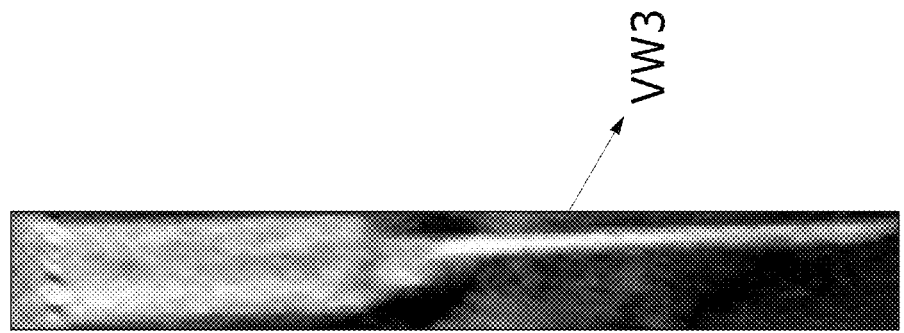
FIG. 9A to FIG. 9C illustrate a schematic diagram of three angles of view images in accordance with an example implementation of the present disclosure.
Figure 9B:
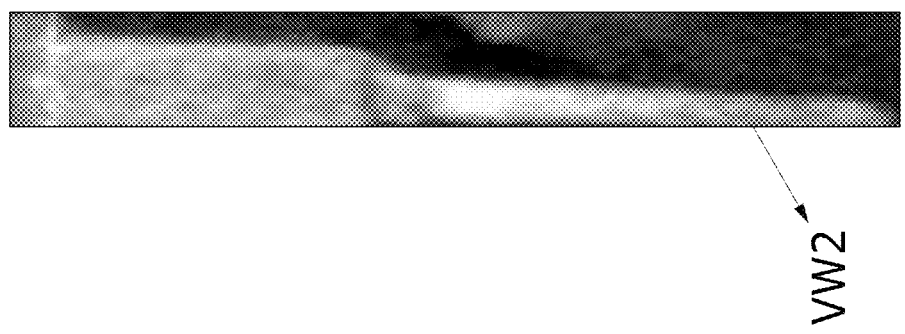
Figure 9A:
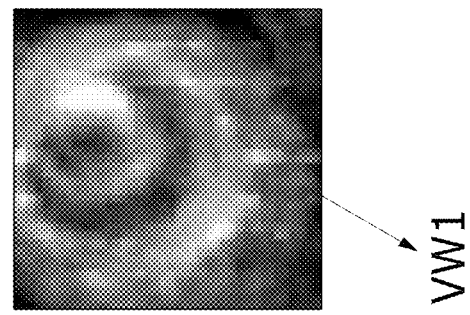

FIG. 9A to FIG. 9C illustrate a schematic diagram of three angles of view images in accordance with an example implementation of the present disclosure.

FIG. 9A shows a first angle of view image VW1 of projecting drill hole voxel data VX" onto a first plane (for example, a plane parallel to an XY plane). FIG. 9B shows a second angle of view image VW2 of projecting drill hole voxel data VX" onto a second plane (for example, a plane parallel to a YZ plane). FIG. 9C shows a third angle of view image VW3 of projecting drill hole voxel data VX" onto a third plane (for example, a plane parallel to an XZ plane). The first plane is orthogonal to the second plane and the third plane, and the second plane is orthogonal to the third plane. A manner of projecting voxel data onto a plane has been described in the foregoing paragraphs, and details are not described herein again.

In this implementation, a drill hole analysis module 217 may obtain at least the first angle of view image VW1 and the second angle of view image VW2, and use the first angle of view image VW1 and the second angle of view image VW2 as an input layer of the deep learning model to be input into the deep learning model, such that the deep learning model outputs an inspection result related to "whether copper leakage occurs in the drill hole." In some implementations, the drill hole analysis module 217 may obtain, for example, only one angle of view image, and use the angle of view image as an input layer of the deep learning model. In some implementations, the drill hole analysis module 217 may alternatively obtain, for example, the first angle of view image VW1, the second angle of view image VW2 and the third angle of view image VW3, and use the first angle of view image VW1, the second angle of view image VW2 and the third angle of view image VW3 as an input layer of the deep learning model, to obtain an inspection result of the drill hole. It should be noted that more angle of view images used for analysis indicate higher inspection accuracy.

In detail, the drill hole analysis module 217 may use, for example, a 2D or 3D convolutional neural network (CNN) for analysis. In this implementation, the drill hole analysis module 217 may use, for example, AlexNet architecture. However, the present disclosure is not limited thereto. In another implementation, alternatively, the drill hole analysis module 217 may directly use, for example, the 3D convolutional neural network, and use the drill hole voxel data VX" as an input layer of the 3D convolutional neural network, such that the 3D convolutional neural network outputs an inspection result related to "whether copper leakage occurs in the drill hole." Accordingly, the drill hole analysis module 217 does not need to project the drill hole voxel data VX" in advance. Persons of ordinary skill can learn an architecture and a training method of convolutional neural networks such as AlexNet from a deep learning related literature. Details are not described in this specification.

In some implementations, the drill hole analysis module 217 may train, for example, different deep learning models for different angle of view images. For example, the drill hole analysis module 217 trains, for example, a first deep learning model for images (for example, an image projecting to an XY plane) having an angle of view the same as that of the first angle of view image VW1, and trains a second deep learning model for images (for example, an image projecting to a plane orthogonal to the XY plane) having an angle of view orthogonal to that of the first angle of view image VW1. Therefore, the first deep learning model may perform an analysis, for example, of the first angle of view image VW1, and the second deep learning model may perform an analysis, for example, of the second angle of view image VW2 and the third angle of view image VW3. In addition, the drill hole analysis module 217 may summarize, for example, the foregoing analysis results into an inspection result.

In some implementations, an output layer of the deep learning model includes, for example, two classifications of "copper leakage" and "no copper leakage," and therefore, the drill hole analysis module 217 may obtain an inspection result related to "whether copper leakage occurs in the drill hole" according to an output result of the deep learning model. In some implementations, an output layer of the deep learning model includes, for example, four classifications of "containing copper but no copper leakage," "not containing copper and no copper leakage," "copper leakage" and "noise," and therefore, the drill hole analysis module 217 may analyze, for example, an output result of the deep learning model, to obtain an inspection result related to "whether copper leakage occurs in the drill hole." In other words, a specific architecture and a training method of the deep learning model are not limited by the present disclosure, and persons of ordinary skill in the art may perform a design according to their requirements on an "inspection result."

In step S211 of FIG. 2, the information output module 219 may output the inspection result through the output component 220.

In this implementation, the inspection result may include a classification conclusion related to "whether copper leakage occurs in the drill hole." However, the present disclosure is not limited thereto. In another implementation, different training processes of the machine learning model are used, so that the drill hole analysis module 217 can alternatively obtain inspection results of different types.

In this implementation, the information output module 219 may record the inspection result by using, for example, a comma-separated value file format (e.g., a .CSV, a .TXT or a .dat file) into the storage component 210. In some implementations, a user may select to review a file corresponding to the inspection result, and the output component 220 displays the inspection result. However, the present disclosure is not limited thereto. In some implementations, the inspection result corresponding to the drill hole is recorded in the storage component 210, and the 2D block BLK corresponding to the drill hole may also be recorded by using, a bitmap file format (e.g., a .BMP file) in the storage component 210, to facilitate reviewing performed by the user.

According to the drill hole inspection method, the drill hole inspection system and the inspection device provided in the implementations of the present disclosure, a data range corresponding to a drill hole of a PCB can be accurately extracted from 3D image voxel data obtained by scanning the PCB, and analyzed to obtain an inspection result of the drill hole. Accordingly, efficiency and accuracy of drill hole inspection can be significantly improved.

From the above description, it is obvious that various technologies can be used to realize the described concepts without departing from the scope of these concepts. In addition, although the concepts have been described by specifically referring to specific implementations, persons of ordinary skill in the art should realize that changes can be made in form and details without departing from the scope of these concepts. In this way, the described implementations are not considered limiting in all aspects. In addition, it should be understood that this application is not limited to the foregoing specific implementations, but a plurality of rearrangements, modifications and replacements can be made thereto without departing from the scope of the present disclosure.

What is claimed is:

1. A drill hole inspection system for inspecting a drill hole in a printed circuit board (PCB), the drill hole inspection system comprising:
   an imaging device configured to scan the PCB to obtain 3-dimensional (3D) image voxel data of the PCB;
   a storage component configured to store a plurality of modules;
   an output component; and
   a processor coupled to the imaging device, the storage component and the output component, and configured to access and execute the plurality of modules stored in the storage component, wherein the plurality of modules comprises:
- a PCB positioning module configured to determine a first-dimension interval corresponding to the PCB along a first direction of the 3D image voxel data;
- a drill hole positioning module configured to determine, in a first plane of the 3D image voxel data, a 2-dimensional (2D) position corresponding to the drill hole, wherein the first direction is orthogonal to the first plane;
- a voxel extraction module configured to extract, according to the first-dimension interval and the 2D position, a portion of the 3D image voxel data as drill hole voxel data;
- a drill hole analysis module configured to analyze the drill hole voxel data to obtain an inspection result of the drill hole; and
- an information output module configured to output the inspection result through the output component, wherein determining the first-dimension interval comprises:
  - projecting the 3D image voxel data onto a second plane to obtain side surface projection data, wherein the second plane points to a second direction and the first direction is orthogonal to the second direction;
  - projecting the side surface projection data onto an axis to obtain 1-dimensional (1D) voxel data, wherein the axis is parallel to the first direction; and
  - determining the first-dimension interval according to the 1D voxel data and a clustering algorithm.

2. The drill hole inspection system of claim 1, wherein the first-dimension interval comprises a start point and an end point that are on the axis.

3. The drill hole inspection system of claim 2, wherein the drill hole positioning module is further configured to determine the first plane according to the start point or the end point.

4. The drill hole inspection system of claim 1, further comprising:
- a receiving component coupled to the processor and configured to receive work order data corresponding to the PCB, wherein the work order data comprises a drill hole coordinate and determining the 2D position corresponding to the drill hole comprises:
- obtaining a 2D block in the first plane according to the drill hole coordinate; and
- determining the 2D position according to a voxel value of the 2D block.

5. The drill hole inspection system of claim 4, wherein the work order data further comprises at least one of a drill hole size and a size tolerance value, wherein obtaining the 2D block in the first plane comprises:
- determining a block size according to the at least one of the drill hole size and the size tolerance value; and
- obtaining the 2D block in the first plane according to the drill hole coordinate and the block size.

6. The drill hole inspection system of claim 4, wherein determining the 2D position according to the voxel value of the 2D block comprises:
- calculating a first center of the 2D block using the voxel value as a weight; and
- comparing the first center with a geometric center of the 2D block to determine the 2D position.

7. The drill hole inspection system of claim 5, wherein the voxel extraction module is further configured to extract the portion of the 3D image voxel data as the drill hole voxel data according to the first-dimension interval, the 2D position and the block size.

8. The drill hole inspection system of claim 1, wherein analyzing the drill hole voxel data to obtain the inspection result of the drill hole comprises:
- obtaining a first angle of view image of the drill hole voxel data projected onto the first plane;
- obtaining a second angle of view image of the drill hole voxel data projected onto the second plane, wherein the first plane is orthogonal to the second plane; and
- inputting the first angle of view image and the second angle of view image to a machine learning model to generate the inspection result.

9. The drill hole inspection system of claim 1, wherein the drill hole is a back drilled hole of the PCB.

10. A drill hole inspection method for using a drill hole inspection system to inspect a drill hole of a printed circuit board (PCB), wherein the drill hole inspection system comprises an imaging device, a processor and an output component, the drill hole inspection method comprising:
- scanning the PCB to obtain 3-dimensional (3D) image voxel data of the PCB by using the imaging device;
- determining a first-dimension interval corresponding to the PCB along a first direction of the 3D image voxel data by using the processor;
- determining, in a first plane of the 3D image voxel data, a 2-dimensional (2D) position corresponding to the drill hole by using the processor, wherein the first direction is orthogonal to the first plane;
- extracting a portion of the 3D image voxel data as drill hole voxel data according to the first-dimension interval and the 2D position by using the processor;
- analyzing the drill hole voxel data to obtain an inspection result of the drill hole by using the processor; and
- outputting the inspection result through the output component by using the processor, wherein determining the first-dimension interval corresponding to the PCB along the first direction of the 3D image voxel data comprises:
  - projecting the 3D image voxel data onto a second plane to obtain side surface projection data, wherein the second plane points to a second direction and the first direction is orthogonal to the second direction;
  - projecting the side surface projection data onto an axis to obtain 1-dimensional (1D) voxel data, wherein the axis is parallel to the first direction; and
  - determining the first-dimension interval according to the 1D voxel data and a clustering algorithm.

11. The drill hole inspection method of claim 10, wherein the first-dimension interval comprises a start point and an end point that are on the axis.

12. The drill hole inspection method of claim 11, further comprising:
- determining the first plane according to the start point or the end point.

13. The drill hole inspection method of claim 10, further comprising:
- receiving work order data corresponding to the PCB, wherein the work order data comprises a drill hole coordinate, and determining, in the first plane of the 3D image voxel data, the 2D position corresponding to the drill hole comprises:
- obtaining a 2D block in the first plane according to the drill hole coordinate; and determining the 2D position according to a voxel value of the 2D block.

14. The drill hole inspection method of claim 13, wherein the work order data further comprises at least one of a drill hole size and a size tolerance value, wherein obtaining the 2D block in the first plane according to the drill hole coordinate comprises:
   determining a block size according to the at least one of the drill hole size and the size tolerance value; and
   obtaining the 2D block in the first plane according to the drill hole coordinate and the block size.

15. The drill hole inspection method of claim 13, wherein determining the 2D position according to the voxel value of the 2D block comprises:
   calculating a first center of the 2D block using the voxel value as a weight; and
   comparing the first center with a geometric center of the 2D block to determine the 2D position.

16. The drill hole inspection method of claim 14, wherein the portion of the 3D image voxel data is extracted as the drill hole voxel data according to the first-dimension interval, the 2D position and the block size.

17. The drill hole inspection method of claim 10, wherein analyzing the drill hole voxel data to obtain the inspection result of the drill hole comprises:
   obtaining a first angle of view image of the drill hole voxel data projected onto the first plane;
   obtaining a second angle of view image of the drill hole voxel data projected onto the second plane, wherein the first plane is orthogonal to the second plane; and
   inputting the first angle of view image and the second angle of view image to a machine learning model to generate the inspection result.

18. An inspection device, comprising:
   a receiving component configured to receive 3-dimensional (3D) image voxel data of a printed circuit board (PCB), wherein the PCB comprises a drill hole;
   an output component;
   a storage component configured to store a plurality of modules; and
   a processor coupled to the receiving component, the output component and the storage component, and configured to access and execute the plurality of modules stored in the storage component, where the plurality of modules comprises:
      a PCB positioning module configured to determine a first-dimension interval corresponding to the PCB along a first direction of the 3D image voxel data;
      a drill hole positioning module configured to determine, in a first plane of the 3D image voxel data, a 2-dimensional (2D) position corresponding to the drill hole, wherein the first direction is orthogonal to the first plane;
      a voxel extraction module configured to extract, according to the first-dimension interval and the 2D position, a portion of the 3D image voxel data as drill hole voxel data;
      a drill hole analysis module configured to analyze the drill hole voxel data to obtain an inspection result of the drill hole; and
      an information output module configured to output the inspection result through the output component, wherein determining the first-dimension interval corresponding to the PCB along the first direction of the 3D image voxel data comprises:
         projecting the 3D image voxel data onto a second plane to obtain side surface projection data, wherein the second plane points to a second direction and the first direction is orthogonal to the second direction;
         projecting the side surface projection data onto an axis to obtain 1-dimensional (1D) voxel data, wherein the axis is parallel to the first direction; and
         determining the first-dimension interval according to the 1D voxel data and a clustering algorithm.

* * * * *